(12) United States Patent
Kao (10) Patent No.: US 12,550,265 B2
(45) Date of Patent: Feb. 10, 2026

(54) HIGH CAPACITANCE MODULE

(71) Applicant: INNODISK CORPORATION, New Taipei (TW)

(72) Inventor: Chih-Chieh Kao, New Taipei (TW)

(73) Assignee: INNODISK CORPORATION, New Taipei (TW)

(*) Notice: Subject to any disclaimer, the term of this patent is extended or adjusted under 35 U.S.C. 154(b) by 267 days.

(21) Appl. No.: 18/326,031

(22) Filed: May 31, 2023

(65) Prior Publication Data
US 2024/0357746 A1   Oct. 24, 2024

(30) Foreign Application Priority Data

Apr. 20, 2023 (TW) ................... 112114711

(51) Int. Cl.
*H05K 1/181* (2026.01)
*H05K 1/182* (2026.01)
*H05K 1/189* (2026.01)

(52) U.S. Cl.
CPC ............. *H05K 1/181* (2013.01); *H05K 1/182* (2013.01); *H05K 1/189* (2013.01); *H05K 2201/09072* (2013.01); *H05K 2201/10015* (2013.01); *H05K 2201/10378* (2013.01); *H05K 2201/10515* (2013.01); *H05K 2201/10522* (2013.01); *H05K 2201/10545* (2013.01); *H05K 2201/10628* (2013.01)

(58) Field of Classification Search
CPC .... H05K 1/14; H05K 1/141–144; H05K 1/18; H05K 1/181–189; H05K 2201/10015; H05K 2201/10378; H05K 2201/10515; H05K 2201/10522; H05K 2201/10545; H01L 23/498

USPC .......................... 361/300–303, 764, 770–795
See application file for complete search history.

(56) References Cited

U.S. PATENT DOCUMENTS

| | | | | |
|---|---|---|---|---|
| 5,493,259 A * | 2/1996 | Blalock | ............... | H01R 13/7195 333/182 |
| 5,889,445 A * | 3/1999 | Ritter | ........................ | H03H 1/02 361/321.2 |
| 6,373,714 B1 * | 4/2002 | Kudoh | .................... | H05K 1/141 361/736 |
| 11,527,364 B2 * | 12/2022 | Tahara | .................... | H01G 2/065 |
| 12,300,568 B2 * | 5/2025 | Lee | ......................... | H01L 24/32 |
| 2009/0199378 A1 * | 8/2009 | Chacko | .................... | H01G 9/15 29/25.03 |
| 2009/0267851 A1 * | 10/2009 | Morris, III | ............... | H01Q 1/38 343/745 |
| 2011/0069466 A1 * | 3/2011 | Herron | .................. | H02M 7/003 361/784 |

(Continued)

FOREIGN PATENT DOCUMENTS

| | | |
|---|---|---|
| CN | 110324984 A | 10/2019 |
| CN | 112702835 A | 4/2021 |
| TW | M613246 U | 6/2021 |

*Primary Examiner* — Tuan T Dinh (57) ABSTRACT

A high capacitance module for electrically connecting to a second circuit board comprises a first circuit board provided with a plurality of metal contacts and at least one capacitor core arranged on the first circuit board. The capacitor cores have connection pins that are electrically connected to the metal contacts through conductive glue. An adhesive layer covers the capacitor cores. The capacitor cores are electrically connected to a memory module arranged on the second circuit board.

11 Claims, 8 Drawing Sheets

(56) References Cited

U.S. PATENT DOCUMENTS

| | | | |
|---|---|---|---|
| 2015/0381121 A1* | 12/2015 | Jones | H01L 23/047 |
| | | | 257/532 |
| 2017/0263570 A1* | 9/2017 | Lin | H01L 24/16 |
| 2018/0240596 A1* | 8/2018 | Son | H01G 4/30 |
| 2020/0185366 A1* | 6/2020 | Bhagavat | H01L 23/49811 |
| 2020/0344894 A1* | 10/2020 | Liu | H05K 3/4038 |
| 2022/0077065 A1* | 3/2022 | Kuan | H01L 23/13 |
| 2023/0063692 A1* | 3/2023 | Wang | H01L 24/14 |

* cited by examiner

FIG. 8

HIGH CAPACITANCE MODULE

CROSS-REFERENCE TO RELATED APPLICATION

This non-provisional application claims priority under 35 U.S.C. § 119 (a) on Patent Application No(s). 112114711 filed in Taiwan, R.O.C. on Apr. 20, 2023, the entire contents of which are hereby incorporated by reference.

BACKGROUND OF THE INVENTION

1. Field of the Invention

The present disclosure relates to a capacitor module, and in particular to a high capacitance module.

2. Description of the Related Art

A tantalum polymer capacitor is an electrolyte-free solid capacitor made of metal tantalum featuring advantages of a small volume and outstanding performance, and is thus currently one of the most suitable components available for backup power supply applications.

In solid-state drive (SSD) applications, in the event of an abnormal power interruption of a system, an SSD controller needs an additional power supply for backup to securely write data in a buffer into a flash memory, so as to prevent loss of data. Accompanied with the evolving technologies of flash memories, the transmission speed continues to increase such that power consumption also gets larger, leading to greater power supply capacity demands of backup power supplies.

In general, requirements for a large power capacity for backup power supplies can be met by means of increasing the capacitance of tantalum polymer capacitors and increasing the charging voltage. However, increasing the capacitance and increasing the charging voltage both enlarge the volume and size of tantalum polymer capacitors. In a package structure of a tantalum polymer capacitor, structures including a tantalum core, a molded housing, a positive lead frame, and a negative lead frame are included, and thus yield a larger volume and occupy a larger space as well.

BRIEF SUMMARY OF THE INVENTION

When the height of electronic components is limited to standardization, it is difficult for current tantalum polymer capacitors to meet design requirements for miniaturization. In addition, when a heat sink is mounted on a memory of an SSD, due to different heights of components of a tantalum polymer capacitor and heights of components of the memory, the heat sink may fail to come into contact in a flat and uniform manner with surfaces of the tantalum polymer capacitor and the memory, thereby undesirably affecting heat dissipation efficiency.

On the basis of the above, the applicant has developed a high capacitance module, which can solve the problem that the height of electronic components is limited by standardization and further solve the issue concerning flat and uniform installation of a heat sink.

To achieve the above and other objectives, the present disclosure provides a high capacitance module adapted to be electrically connected to a circuit board, and the high capacitance module includes: a first circuit board, provided with a plurality of metal contacts; at least one capacitor core, arranged on the first circuit board, the at least one capacitor core having connection pins and being electrically connected to the metal contacts via a conductive glue; and an adhesive layer, covering the at least one capacitor core; wherein the at least one capacitor core is electrically connected to a memory module arranged on the circuit board.

In some embodiments, the first circuit board comprises, for example, a flexible printed circuit board (FPCB).

In some embodiments, the adhesive layer comprises, for example, an epoxy resin.

In some embodiments, the capacitor cores are disposed by means of Chip On Board (COB) on the first circuit board.

In some embodiments, the first circuit board is further provided thereon with a power control module, which is covered along with the capacitor cores by the adhesive layer.

In some embodiments, a heat sink in contact with surfaces of the memory module and the adhesive layer is further included.

In some embodiments, the material of the conductive glue is selected from a group consisting of silver glue, copper glue, tin glue, and platinum glue.

In some embodiments, the capacitor cores are located in a hollow portion of the circuit board.

In some embodiments, the capacitor cores are respectively arranged on different surfaces of the first circuit board.

In some embodiments, the capacitor cores are simultaneously arranged on different surfaces of the first circuit board.

In some embodiments, the polarity of the metal contacts is in a symmetrical design.

Thus, as the high capacitance module of the present disclosure does not include structures such as a molded housing, a positive lead frame or a negative lead frame, the space occupied by the lead frames can be eliminated therefrom, and thus smaller volume size and height are provided to thereby solve the problem that the height of electronic components is limited to standardization and to meet design requirements for miniaturization. In addition, because the overall height of the high capacitance module can be adjusted based on the number of capacitor cores and the thickness of the adhesive layer, the height of the high capacitance module can be substantially consistent with the height of the memory module. Accordingly, a heat sink is allowed to come into contact in a flat and uniform manner with surfaces of the memory module and the high capacitance module, thereby improving heat dissipation efficiency.

DETAILED DESCRIPTION OF THE INVENTION

To facilitate understanding of the objectives, characteristics, and effects of this present disclosure, embodiments together with the attached drawings for the detailed description of the present disclosure are provided.

Figure 1:
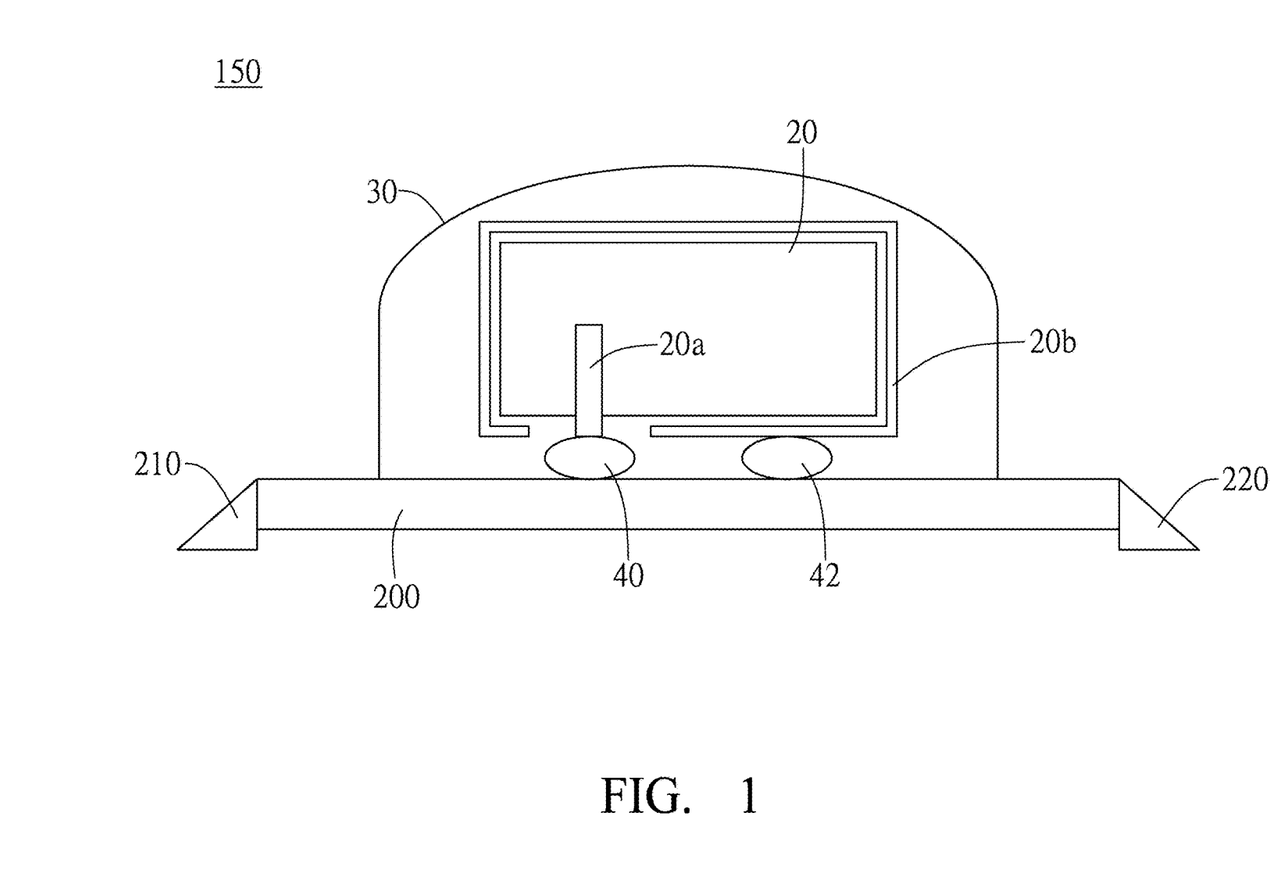
FIG. 1 is a structural schematic diagram of a high capacitance module according to an embodiment of the present disclosure.

Refer to FIG. 1, which shows a high capacitance module 150 according to an embodiment of the present disclosure. The high capacitance module 150 includes a capacitor core 20, a first connection pin 20a, a second connection pin 20b, an adhesive layer 30, a plurality of conductive glues 40, 42, a first circuit board 200, a first metal contact 210 and a second metal contact 220.

The capacitor core 20 is made of metal tantalum as an anode material. In some embodiments, the capacitor core 20 may also be made of aluminum or other materials as an anode material. The first connection pin 20a, facing downward and exposed outside the capacitor core 20, is provided in the capacitor core 20. The first connection pin 20a serves as an anode. The second connection pin 20b is provided on an outer periphery of the capacitor core 20. The second connection pin 20b serves as a cathode. An insulating layer (not shown) may be arranged on a periphery of the first connection pin 20a exposed outside the capacitor core 20, so as to prevent a contact with the second connection pin 20b that may lead to a problem of short-circuitry. The first connection pin 20a is electrically connected to the first metal contact 210 via the conductive glue 40, such that the first metal contact 210 serves as an anode. The second connection pin 20b is electrically connected to the second metal contact 220 via the conductive glue 42, such that the second metal contact 220 serves as a cathode. Moreover, to better present the drawings, metal lines (not shown) on the first circuit board 200 are omitted from the drawings, wherein the metal lines are used to respectively connect the conductive glue 40 with the first metal contact 210, and connect the conductive glue 42 with the second metal contact 220.

The adhesive layer 30 covers the capacitor core 20. The adhesive layer 30 may be an epoxy resin, a polyurethane hot melt adhesive, silicone, or other suitable adhesive materials. An epoxy resin is used in this embodiment. The adhesive layer 30 may cover the capacitor core 20 by using an automatic adhesive dispensing apparatus to form a protection layer for the capacitor core 20, so as to isolate from air, impurities, light, or moisture. Since the adhesive layer 30 has plasticity before curing, the height, thickness, or shape of the adhesive layer 30 can be adjusted according to installation space requirements, so as to meet the height restriction requirements of electronic components.

The conductive glues 40 and 42 are located between the capacitor core 20 and the first circuit board 200. The conductive glues 40 and 42 are electrically connected to the first connection pin 20a and the second connection pin 20b, respectively. In some embodiments, the materials of the conductive glues 40 and 42 selected from a group consisting of silver glue, copper glue, tin glue and platinum glue. A silver glue is used in this embodiment. Similarly, since the conductive glues 40 and 42 have plasticity before curing, the heights, thicknesses or shapes of the conductive glues 40 and 42 can be adjusted according to installation space requirements, so as to meet the height restriction requirements of electronic components.

The first circuit board 40 is provided with the first metal contact 210 and the second metal contact 220. The first metal contact 210 can be electrically connected to the conductive glue 40 via a metal line (conductive trace) on the first circuit board 220, and the second metal contact 220 can also be electrically connected to the conductive glue 42 via a metal line on the first circuit board 200. The first circuit board 200 can be, for example, a flexible printed circuit board (FPCB) or a thin circuit board.

It should be noted that, as the high capacitance module of the present disclosure does not include structures such as a molded housing, a positive lead frame, or a negative lead frame, the space occupied by the lead frames can be eliminated therefrom, and thus smaller volume size and lower height are provided to thereby solve the problem that the height of electronic components is limited to standardization and to meet design requirements for miniaturization. Moreover, the high capacitance module 150 can include multiple capacitor cores 20 to increase the capacitance so as to meet requirements of increased power supply capacity for backup power supplies. For example, within the same unit area, a conventional backup power supply may be provided with 5 tantalum polymer capacitors; however, the high capacitance module 150 of the present disclosure may be provided with 8 capacitor cores 20, hence increasing the capacitance as well as meeting requirements of increased power supply capacity for backup power supplies.

Figure 2:
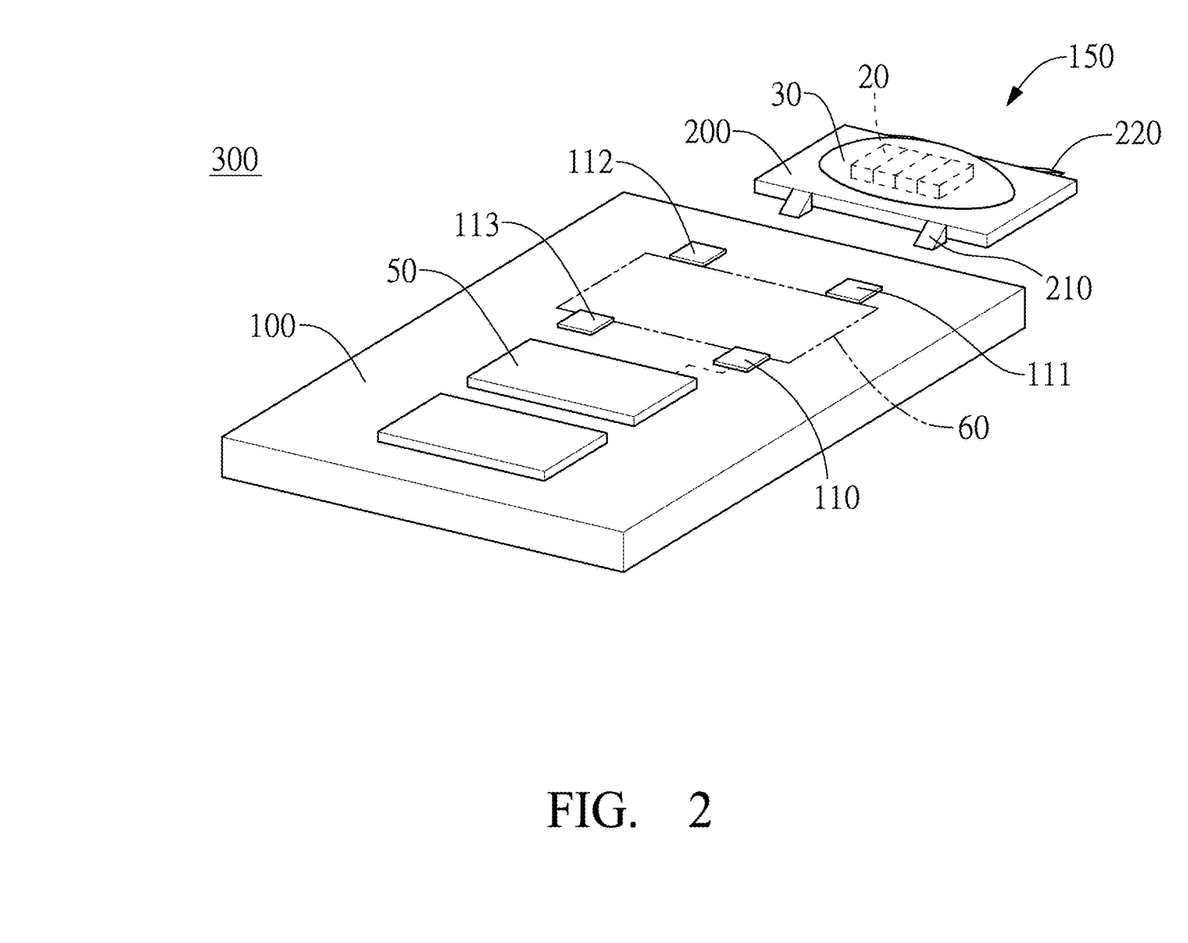
FIG. 2 is a schematic diagram of installation of a high capacitance module according to an embodiment of the present disclosure.

Refer to FIG. 2 which shows a schematic diagram of installation of a high capacitance module according to an embodiment of the present disclosure. A high capacitance capacitor 150 is detachably arranged on a circuit board 100. More specifically, the second circuit board 100 is provided thereon with a memory module 50 and a mounting region 60. The memory module 50 may be, for example but not limited to, a single-level cell (SLC) NAND flash memory module, a multi-level cell (MLC) NAND flash memory module, a triple-level cell (TLC) NAND flash memory module, or a quad-level cell (QLC) NAND flash memory module. A plurality of metal connection pads 110, 111, 112, 113 are provided around the mounting region 60. The metal connection pad 110 is used to correspondingly connect to the metal contact 210 on the first circuit board 200, the metal connection pad 111 is used to correspondingly connect to the metal contact 220 on the first circuit board 200, and so forth. When the high capacitance module 150 is arranged in the mounting region 60, the metal contact 210 and the metal connection pad 110 and the metal contact 220 and the metal connection pad 111 are fixed are fixed by means of a soldering or welding process, and so forth, such that the capacitor core 20 becomes electrically connected to the memory module 50 on the second circuit board 100. It should be noted that, the polarities of the metal connection pad 110, the metal connection pad 111, the metal connection pad 112 and the metal connection pad 114 are in a symmetrical design. Thus, when the first circuit board 200 is mounted on the second circuit board 100, the assembly direction does not need to be specifically adjusted, hence enhancing convenience and speed for assembly. For example, both the metal connection pad 110 and the metal connection pad 112 are designed to have a positive polarity, and the metal connection pad 111 and the metal connection pad 113 are designed to have a negative polarity, so as to implement the symmetrical design described above. In addition, the capacitor core 20 is arranged by means of Chip On Board (COB) on the first circuit board 200 to thereby enhance manufacturing convenience. The thickness of the first circuit board 200 is less than that of the second circuit board 100.

Figure 3:
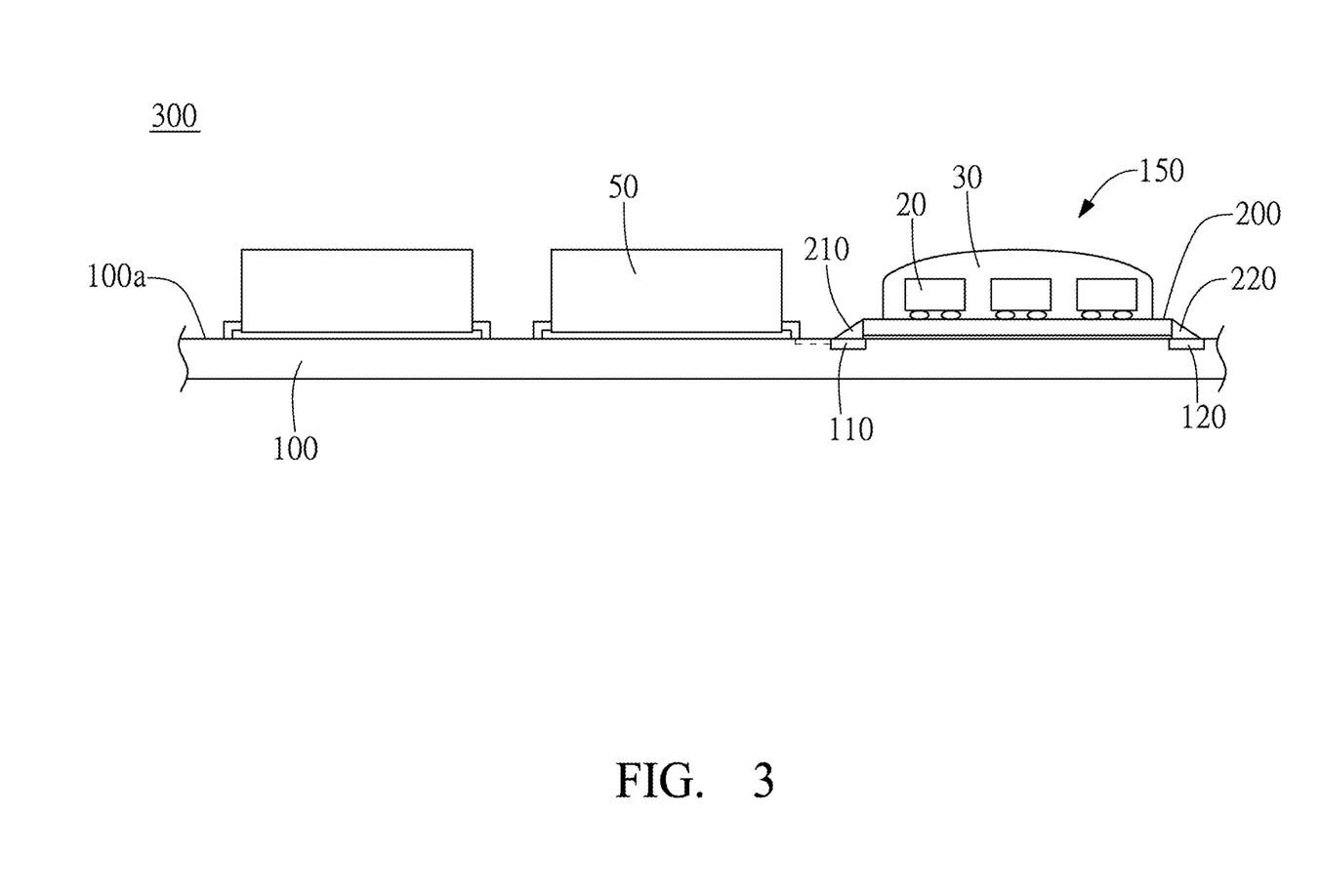
FIG. 3 is a structural schematic diagram of a high capacitance module mounted on a memory device according to an embodiment of the present disclosure.

Refer to FIG. 3 which shows a structural schematic diagram of a high capacitance module mounted on a memory device according to an embodiment of the present disclosure. A memory device 300 includes a second circuit board 100, a memory module 50, and a high capacitance module 150. The high capacitance module 150 is arranged on a first surface 100*a* of the second circuit board 100. The number of capacitor cores 20 on the high capacitance module 150 can be adjusted according to design requirements, so as to meet various power supply capacity specification requirements.

Figure 4:
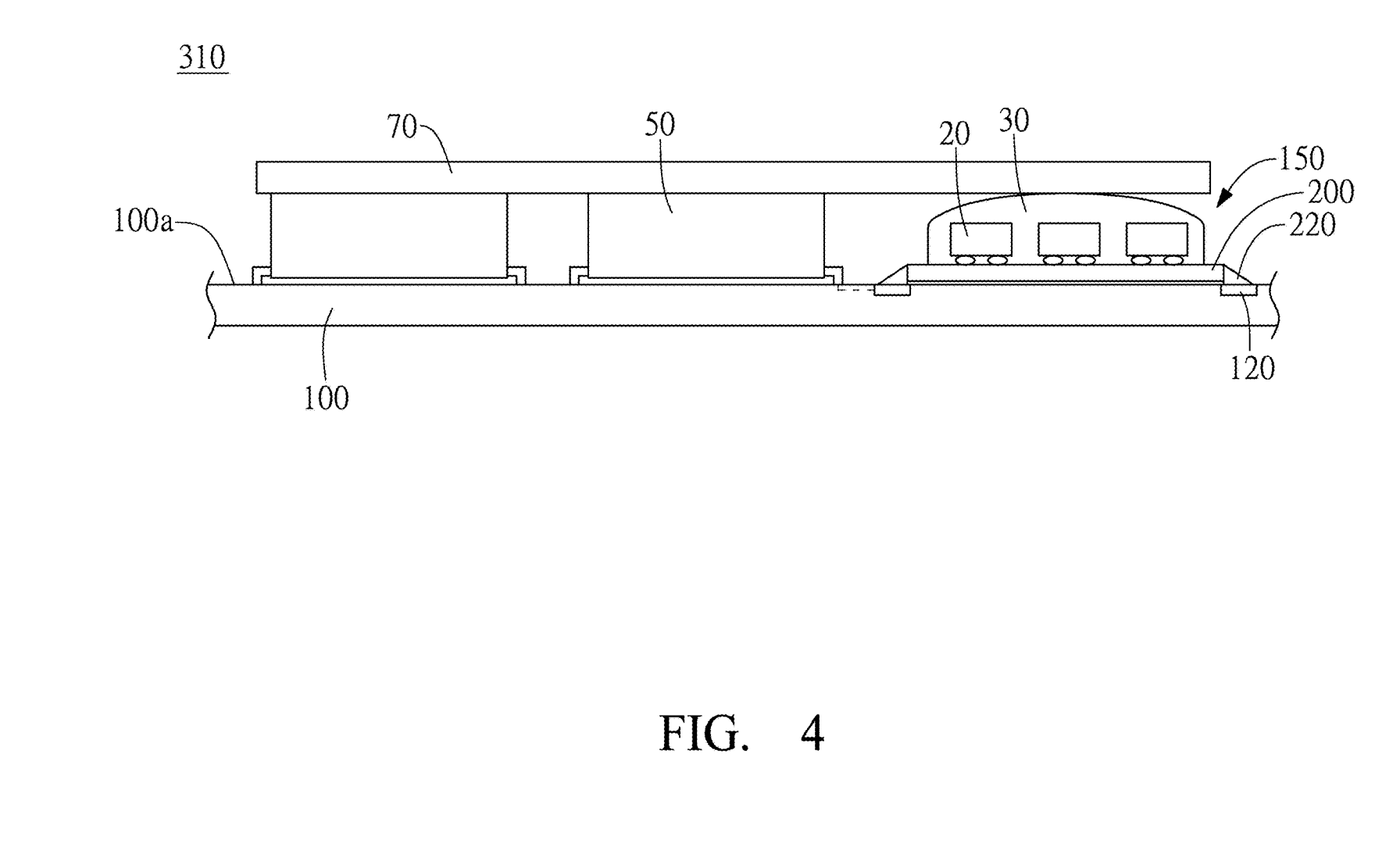
FIG. 4 is a structural schematic diagram of a high capacitance module mounted on a memory device having a heatsink according to an embodiment of the present disclosure.

Refer to FIG. 4 which shows a structural schematic diagram of a high capacitance module mounted on a memory device having a heat sink according to an embodiment of the present disclosure. A memory device 310 includes a second circuit board 100, a memory module 50, a heat sink 70, and a high capacitance module 150. The high capacitance module 150 is arranged on a first surface 100*a* of the second circuit board 100. The heat sink 70 is mounted (by means of, for example, attaching) over the memory module 50 and the high capacitance module 150. More specifically, the heat sink 70 is mounted over the memory module 50 and an adhesive layer 30 of the high capacitance capacitor 150, and the heat sink 70 is in contact with surfaces of the memory module 50 and the high capacitance capacitor 150. In addition, because the overall height of the high capacitance module 150 can be adjusted based on the number of the capacitor core 20 and the thickness of the adhesive layer 30, the height of the high capacitance module 150 can be substantially consistent with the height of the memory module 50. Accordingly, the heat sink 70, when mounted on the high capacitance module 310, is allowed to come into contact in a flat and uniform manner with the surfaces of the memory module 50 and the high capacitance module 150, thereby overcoming the problem of heat dissipation undesirably affected by the heat sink 70 not being able to come into contact in a flat and uniform manner with the electronic components.

Figure 5:
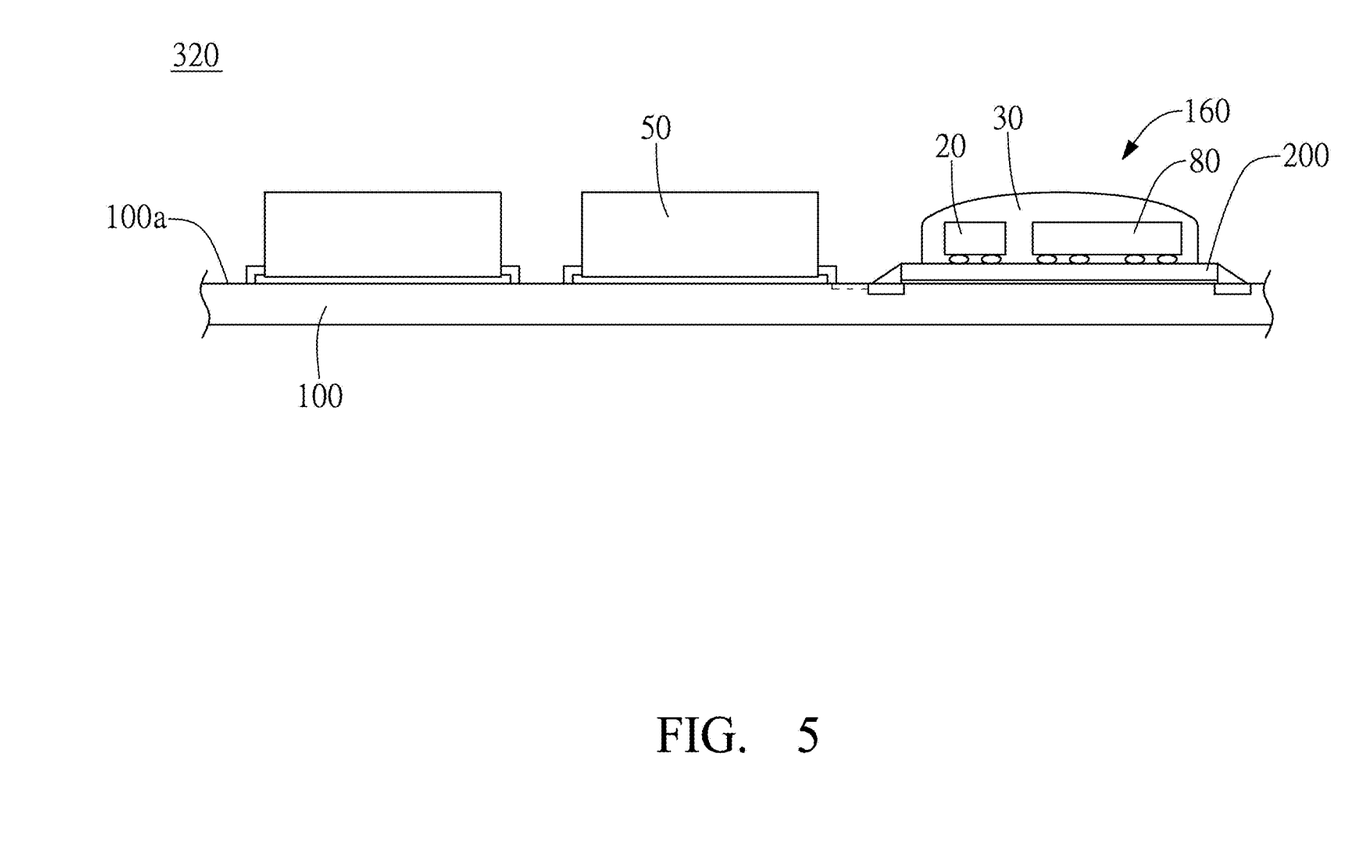
FIG. 5 is a structural schematic diagram of a high capacitance module mounted on a memory device according to an embodiment of the present disclosure.

Refer to FIG. 5 which shows a structural schematic diagram of a high capacitance module mounted on a memory device according to some embodiments of the present disclosure. A memory device 320 includes a second circuit board 100, a memory module 50, and a high capacitance module 160. The high capacitance module 160 in FIG. 5 differs from the high capacitance module 150 in FIG. 3 in that, a first circuit board 200 is further arranged with a power control module 80, and the power control module 80 is covered along with the capacitor core 20 by the adhesive layer 30. The remaining details are the same as those of the embodiment in FIG. 3, and are omitted herein for brevity. Accordingly, the power control module 80 is covered by the adhesive layer 30 to isolate from air, impurities, light, or moisture.

Figure 6:
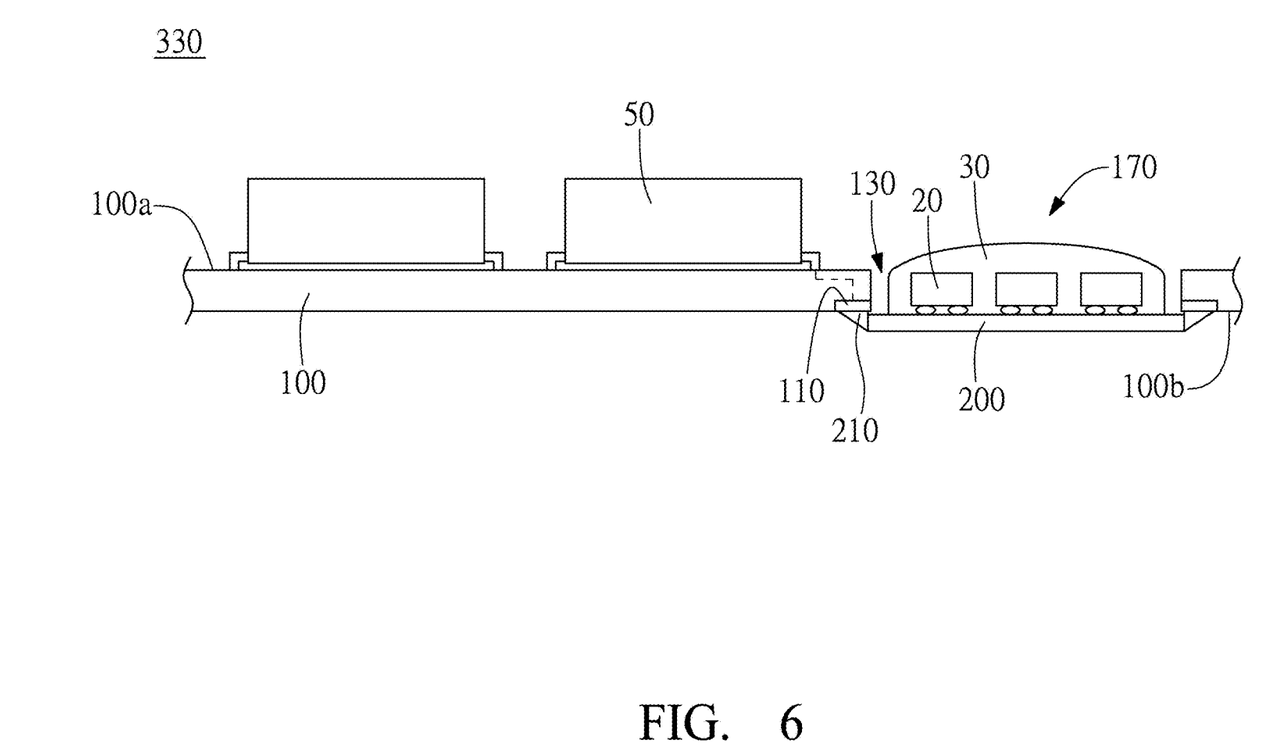
FIG. 6 is a structural schematic diagram of a high capacitance module mounted on a memory device according to an embodiment of the present disclosure.

Refer to FIG. 6 which shows a structural schematic diagram of a high capacitance module mounted on a memory device according to some embodiments of the present disclosure. A memory device 330 includes a second circuit board 100, a memory module 50, a hollow portion 130, and a high capacitance module 170. The embodiment in FIG. 6 differs from that in FIG. 3 in that, the second circuit board 100 has the hollow portion 130 thereon, and a first circuit board 200 is electrically connected to a metal connection pad 110 on a second surface 110*b* of the circuit board 100 via a metal contact 210. The capacitor core 20 is located in the hollow portion 130 of the circuit board 100. Accordingly, when one side of the high capacitance module 170 has a special height restriction, the requirements for the height restriction can be met by the installation means of this embodiment.

Figure 7:
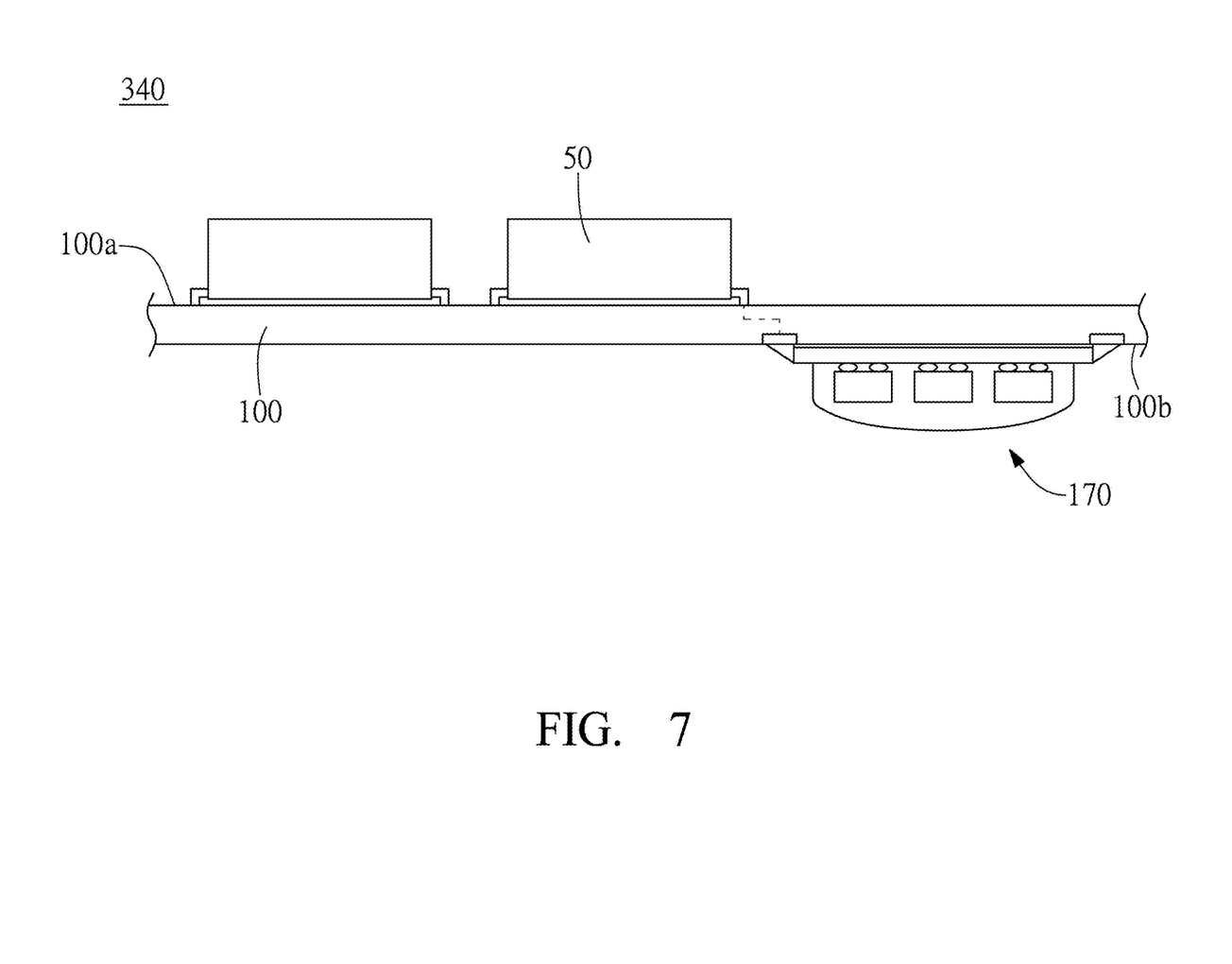
FIG. 7 is a structural schematic diagram of a high capacitance module mounted on a memory device according to an embodiment of the present disclosure.

Refer to FIG. 7 which shows a structural schematic diagram of a high capacitance module mounted on a memory device according to some embodiments of the present disclosure. A memory device 340 includes a second circuit board 100, a memory module 50, and a high capacitance module 170. The embodiment in FIG. 7 differs from the embodiment in FIG. 3 in that, the high capacitance capacitor 170 is arranged on a second surface 100*b* of a second circuit board 100. Accordingly, when one side of the circuit board 100 has a special height restriction, the requirements for the height restriction can be met by the installation means of this embodiment.

Figure 8:
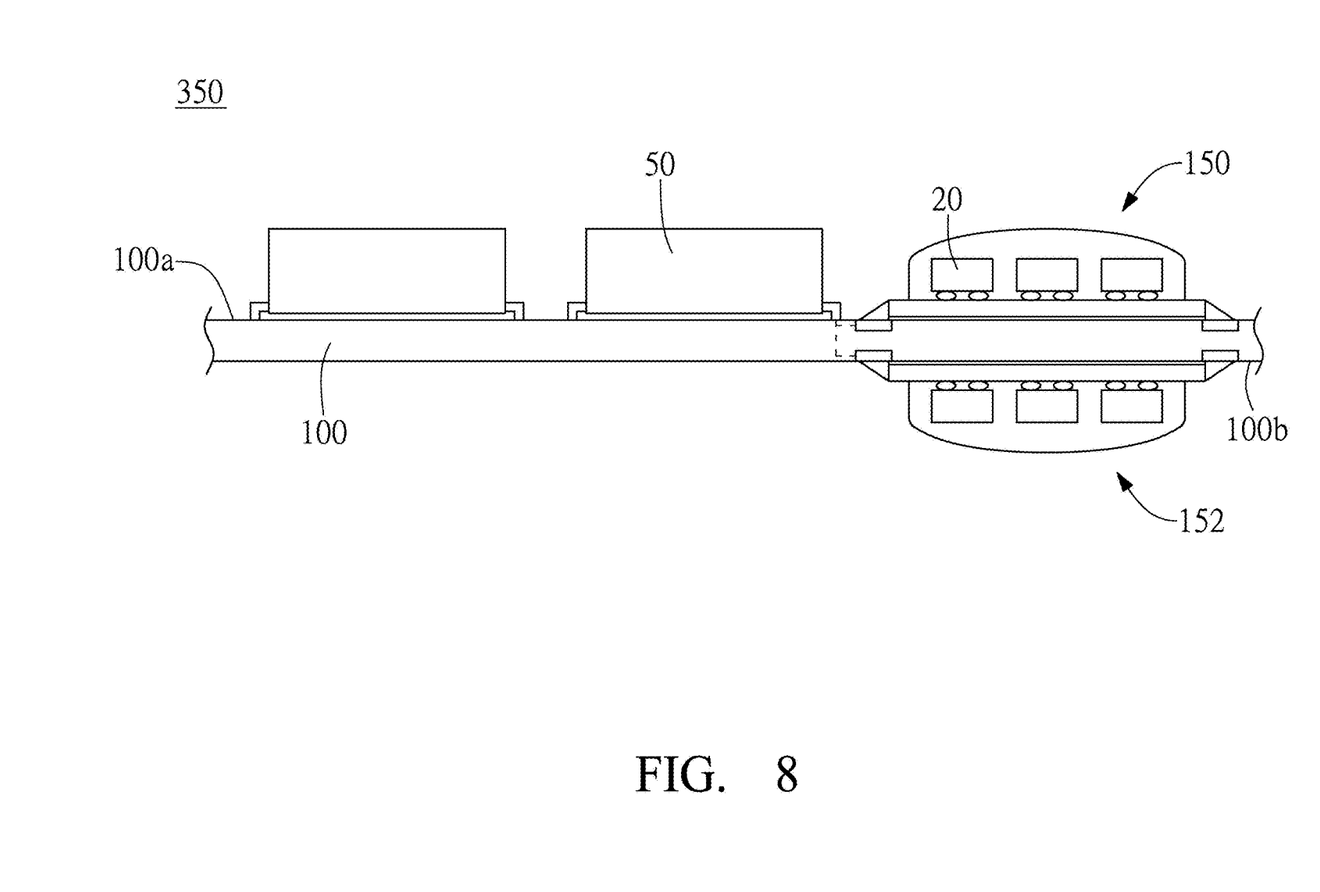
FIG. 8 is a structural schematic diagram of a high capacitance module mounted on a memory device according to an embodiment of the present disclosure.

Refer to FIG. 8 which shows a structural schematic diagram of a high capacitance module mounted on a memory device according to some embodiments of the present disclosure. A memory device 350 includes a second circuit board 100, a memory module 50, a high capacitance module 150, and a high capacitance module 152. The embodiment in FIG. 8 differs from the embodiment in FIG. 3 in that, the high capacitance capacitor 150 is arranged on a first surface 110*a* of a circuit board 100, and the high capacitance capacitor 152 is arranged on a second surface 100*b* of the circuit board 100. In other words, the capacitor cores 20 are arranged on different surfaces of the second circuit board 100, respectively. Accordingly, when the memory device 350 has a special power supply capacity requirement, the power supply capacity of a backup power supply can be increased by the installation means of this embodiment.

In conclusion, as the high capacitance module of the present disclosure does not include structures such as a molded housing, a positive lead frame, or a negative lead frame, the space occupied by the lead frames can be eliminated therefrom compared to a conventional tantalum polymer capacitor, and thus smaller volume size and height are provided to thereby solve the problem that the height of electronic components is limited to standardization and to meet design requirements for miniaturization. In addition, because the overall height of the high capacitance module can be adjusted based on the number of the capacitor cores and the thickness of the adhesive layer, the height of the high capacitance module can be substantially consistent with the height of the memory module. Accordingly, a heat sink is allowed to come into contact in a flat and uniform manner with surfaces of the memory module and the high capacitance module, thereby improving heat dissipation efficiency.

The present invention is described by way of the preferred embodiments above. A person skilled in the art should understand that, these embodiments are merely for describing the present invention and are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. A high capacitance module, adapted to be electrically connected to a second circuit board, the high capacitance module comprising:

a first circuit board, provided with a plurality of metal contacts;

at least one capacitor, which does not include a molded housing, a positive lead frame, and a negative lead frame, consisting of a capacitor core and connection pins, wherein the capacitor core is arranged on the first circuit board, and the connection pins are electrically connected to the plurality of metal contacts via a conductive glue; and an adhesive layer, directly covering all outer surfaces of the capacitor, the connecting pins, and the conductive glue;

wherein the capacitor core is electrically connected to a memory module arranged on the second circuit board.

2. The high capacitance module according to claim 1, wherein the first circuit board is a flexible printed circuit board (FPCB).

3. The high capacitance module according to claim 1, wherein the adhesive layer is an epoxy resin.

4. The high capacitance module according to claim 1, wherein the capacitor core is arranged by means of Chip On Board (COB) on the first circuit board.

5. The high capacitance module according to claim 1, wherein the first circuit board is further provided thereon with a power control module, which is covered along with the capacitor core by the adhesive layer.

6. The high capacitance module according to claim 1, further comprising a heat sink in contact with surfaces of the memory module and the adhesive layer.

7. The high capacitance module according to claim 1, wherein a material of the conductive glue is selected from a group consisting of silver glue, copper glue, tin glue, and platinum glue.

8. The high capacitance module according to claim 1, wherein the capacitor core is located in a hollow portion of the second circuit board.

9. The high capacitance module according to claim 1, wherein the capacitor core is respectively arranged on different surfaces of the second circuit board.

10. The high capacitance module according to claim 1, wherein the capacitor core is simultaneously arranged on different surfaces of the second circuit board.

11. The high capacitance module according to claim 1, wherein a polarity of the plurality of metal contacts is in a symmetrical design.

\* \* \* \* \*